(12) United States Patent
Kinuta et al.

(10) Patent No.: US 11,148,411 B2
(45) Date of Patent: Oct. 19, 2021

(54) PRINTING DEVICE AND PRINTING METHOD

(71) Applicant: FUJI CORPORATION, Chiryu (JP)

(72) Inventors: Minoru Kinuta, Chiryu (JP); Shoji Fukakusa, Yokkaichi (JP); Kento Asaoka, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 132 days.

(21) Appl. No.: 16/305,759

(22) PCT Filed: Jun. 17, 2016

(86) PCT No.: PCT/JP2016/068084
§ 371 (c)(1),
(2) Date: Nov. 29, 2018

(87) PCT Pub. No.: WO2017/216951
PCT Pub. Date: Dec. 21, 2017

(65) Prior Publication Data
US 2020/0093003 A1    Mar. 19, 2020

(51) Int. Cl.
*B41F 15/46*      (2006.01)
*B41M 1/12*      (2006.01)
(Continued)

(52) U.S. Cl.
CPC .......... *B41F 15/46* (2013.01); *B41F 15/0881* (2013.01); *B41F 15/423* (2013.01);
(Continued)

(58) Field of Classification Search
CPC .............. H05K 3/1233; H05K 3/1225; H05K 2203/0139; H05K 3/3485; B41F 15/46;
(Continued)

(56) References Cited

U.S. PATENT DOCUMENTS

2014/0331874 A1    11/2014   Kim

FOREIGN PATENT DOCUMENTS

GB        2364668    *   6/2002
JP         9-323400 A     12/1997
(Continued)

OTHER PUBLICATIONS

International Search Report dated Sep. 6, 2016 in PCT/JP2016/068084 filed on Jun. 17, 2016.
(Continued)

*Primary Examiner* — Laura Edwards
(74) *Attorney, Agent, or Firm* — Oblon, McClelland, Maier & Neustadt, L.L.P.

(57) ABSTRACT

A solder paste printer for which a pressing force of squeegee towards a stencil when spreading solder paste is smaller than a printing pressure when performing solder paste printing. The force with which the solder paste is pressed downwards by the squeegee is weak, and instead of solder paste being pressed down, it spreads along the squeegee. Also, the moving speed of the squeegee when spreading the solder paste is faster than the moving speed of the squeegee when printing solder paste. Thus, because the squeegee is moving fast, before the solder paste is pressed down sufficiently to be printed, the solder paste spreads out along the squeegee. Accordingly, it is possible to appropriately spread the solder paste along the direction in which the squeegee extends.

6 Claims, 7 Drawing Sheets

(51) Int. Cl.
    *B41F 15/08*       (2006.01)
    *B41F 15/42*       (2006.01)
    *H05K 3/12*        (2006.01)
    *B41M 3/00*       (2006.01)
    *H05K 3/34*        (2006.01)

(52) U.S. Cl.
    CPC .............. *B41M 1/12* (2013.01); *B41M 3/006* (2013.01); *H05K 3/1225* (2013.01); *H05K 3/1233* (2013.01); *H05K 3/3485* (2020.08); *H05K 2203/0139* (2013.01)

(58) Field of Classification Search
    CPC ..... B41F 15/0881; B41F 15/423; B41M 1/12; B41M 3/006; B05C 9/025; B05C 17/04; B05C 17/06; B05C 17/08; B05C 11/10
    USPC ................................................ 118/213, 301
    See application file for complete search history.

(56) References Cited

FOREIGN PATENT DOCUMENTS

| | | |
|---|---|---|
| JP | 11-216840 A | 8/1999 |
| JP | 2000-255029 A | 9/2000 |
| JP | 2001-18360 A | 1/2001 |
| JP | 2011-161724 A | 8/2011 |

OTHER PUBLICATIONS

Office Action dated Jun. 23, 2020 in corresponding Japanese Patent Application No. 2018-523140, 4 pages.

\* cited by examiner

PRINTING DEVICE AND PRINTING METHOD

TECHNICAL FIELD

The present invention relates to a printing device and a printing method for printing a viscous material loaded on an upper surface of a stencil onto a board via through-holes in the stencil by sliding a squeegee along the upper surface of the stencil.

BACKGROUND ART

In a printing device, as disclosed in the patent literature below, a board is closely contacted against a lower surface of a stencil and a viscous material is ejected onto an upper surface of the stencil by an ejecting device. Then, by sliding a squeegee across the upper surface of the stencil, the viscous material is printed onto the board via through-holes in the stencil.
Patent literature 1: JP-A-2011-161724

SUMMARY OF INVENTION

Technical Problem

There are known printing devices for which the ejection device that ejects viscous material onto an upper surface of a stencil is able to move in a direction in which a squeegee extends. With such a printing device, by ejecting the viscous material in the direction in which the squeegee extends, it is possible to print the viscous material on the board across the entire width of the squeegee. However, to reduce design costs and due to space restrictions, there are printing devices for which the ejecting device is not movable in the direction in which the squeegee extends. With such a printing device, it is not possible to eject the viscous material in the direction in which the squeegee extends, and the viscous material is ejected onto the upper surface of the stencil in a single blob. When the viscous material is ejected in a single blob like this, the viscous material can only be printed on the board across a small region of the squeegee. Therefore, it is necessary to spread the viscous material ejected in a blob in the direction in which the squeegee extends, thus, an object of the present invention is to appropriately spread a viscous material.

Solution to Problem

To solve the above problems, a printing device of the present invention includes: a squeegee configured to slide on an upper surface of a stencil in which through-holes are formed; a moving device configured to move the squeegee back and forth along a specified direction; and a control device configured to control operation of the moving device, the control device including a spreading section configured to spread a viscous material loaded on the upper surface of the stencil in a direction in which the squeegee extends by sliding the squeegee, and a printing section configured to squeeze the viscous material that was spread by the spreading section into the through-holes of the stencil by sliding the squeegee such that the viscous material is printed onto a board that is closely contacting a lower surface of the stencil, wherein a pressing force of the squeegee towards the stencil when the squeegee is slid by the spreading section is smaller than a pressing force of the squeegee towards the stencil when the squeegee is slid by the printing section.

To solve the above problems, a printing device of the present invention includes: a squeegee configured to slide on an upper surface of a stencil in which through-holes are formed; a moving device configured to move the squeegee back and forth along a specified direction; and a control device configured to control operation of the moving device, the control device including a spreading section configured to spread a viscous material loaded on the upper surface of the stencil in a direction in which the squeegee extends by sliding the squeegee, and a printing section configured to squeeze the viscous material that was spread by the extending section into the through-holes of the stencil by sliding the squeegee such that the viscous material is printed onto a board that is closely contacting a lower surface of the stencil, wherein a moving speed of the squeegee when the squeegee is slid by the spreading section is greater than a moving speed of the squeegee when the squeegee is slid by the printing section.

Also, to solve the above problems, a printing method of the present invention is a printing method for printing a viscous material onto a board that is closely contacting a lower surface of a stencil using a printing device that includes a squeegee configured to slide on an upper surface of a stencil in which through-holes are formed and a moving device configured to move the squeegee back and forth along a specified direction, the printing method including: spreading the viscous material loaded on the upper surface of the stencil in a direction in which the squeegee extends by sliding the squeegee; and printing the viscous material that was spread during the spreading onto the board by squeezing the viscous material into the through-holes of the stencil by sliding the squeegee, wherein a pressing force of the squeegee towards the stencil when the squeegee is slid during the spreading is smaller than a pressing force of the squeegee towards the stencil when the squeegee is slid during the printing.

Also, to solve the above problems, a printing method of the present invention is a printing method for printing a viscous material onto a board that is closely contacting a lower surface of a stencil using a printing device that includes a squeegee configured to slide on an upper surface of a stencil in which through-holes are formed and a moving device configured to move the squeegee back and forth along a specified direction, the printing method including: spreading the viscous material loaded on the upper surface of the stencil in a direction in which the squeegee extends by sliding the squeegee; and printing the viscous material that was spread during the spreading onto the board by squeezing the viscous material into the through-holes of the stencil by sliding the squeegee, wherein a moving speed of the squeegee when the squeegee is slid during the spreading is greater than a moving speed of the squeegee when the squeegee is slid during the printing.

Advantageous Effects

With a printing device and a printing method of the present invention, a pressing force of the squeegee towards the stencil when spreading the viscous material, that is, the printing pressure, is smaller than the printing pressure when printing the viscous material onto the board. Therefore, the force with which the viscous material is pressed down by the squeegee becomes weaker, and the viscous material is spread out along the squeegee instead of being pressed down. Accordingly, it is possible to appropriately spread the viscous material along the direction in which the squeegee extends.

Also, with a printing device and a printing method of the present invention, a moving speed of the squeegee when the viscous material is being spread is greater than a moving speed of the squeegee when the viscous material is being printed. Thus, because the squeegee is moving fast, before the viscous material is pressed down sufficiently to be printed, the viscous material spreads out along the squeegee. Accordingly, it is possible to appropriately spread the viscous material along the direction in which the squeegee extends.

DESCRIPTION OF PREFERRED EMBODIMENTS

The following describes in detail referring to the figures an example embodiment of the present invention.

First Embodiment

Configuration of Solder Paste Printer

Figure 1:
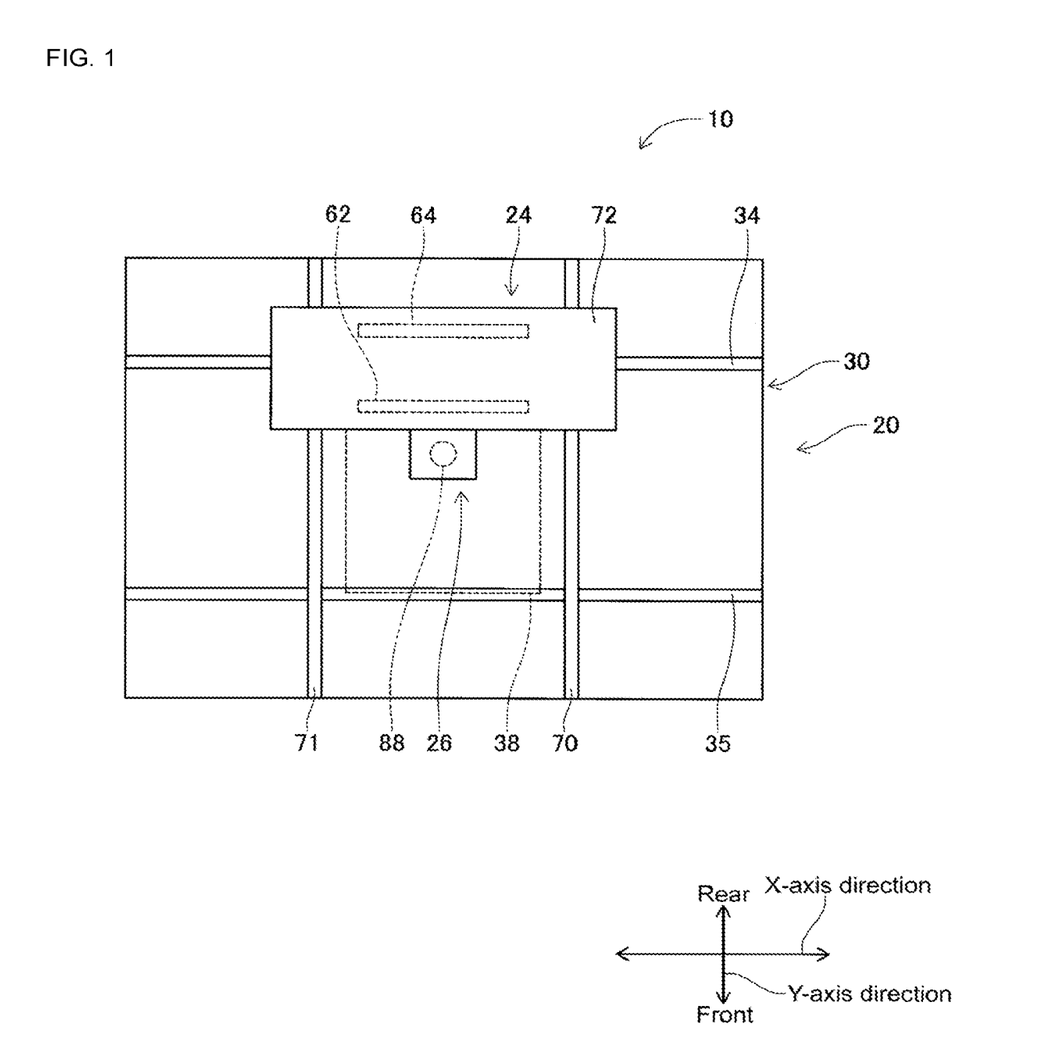
FIG. 1 is a plan view of a solder paste printer.
Figure 2:
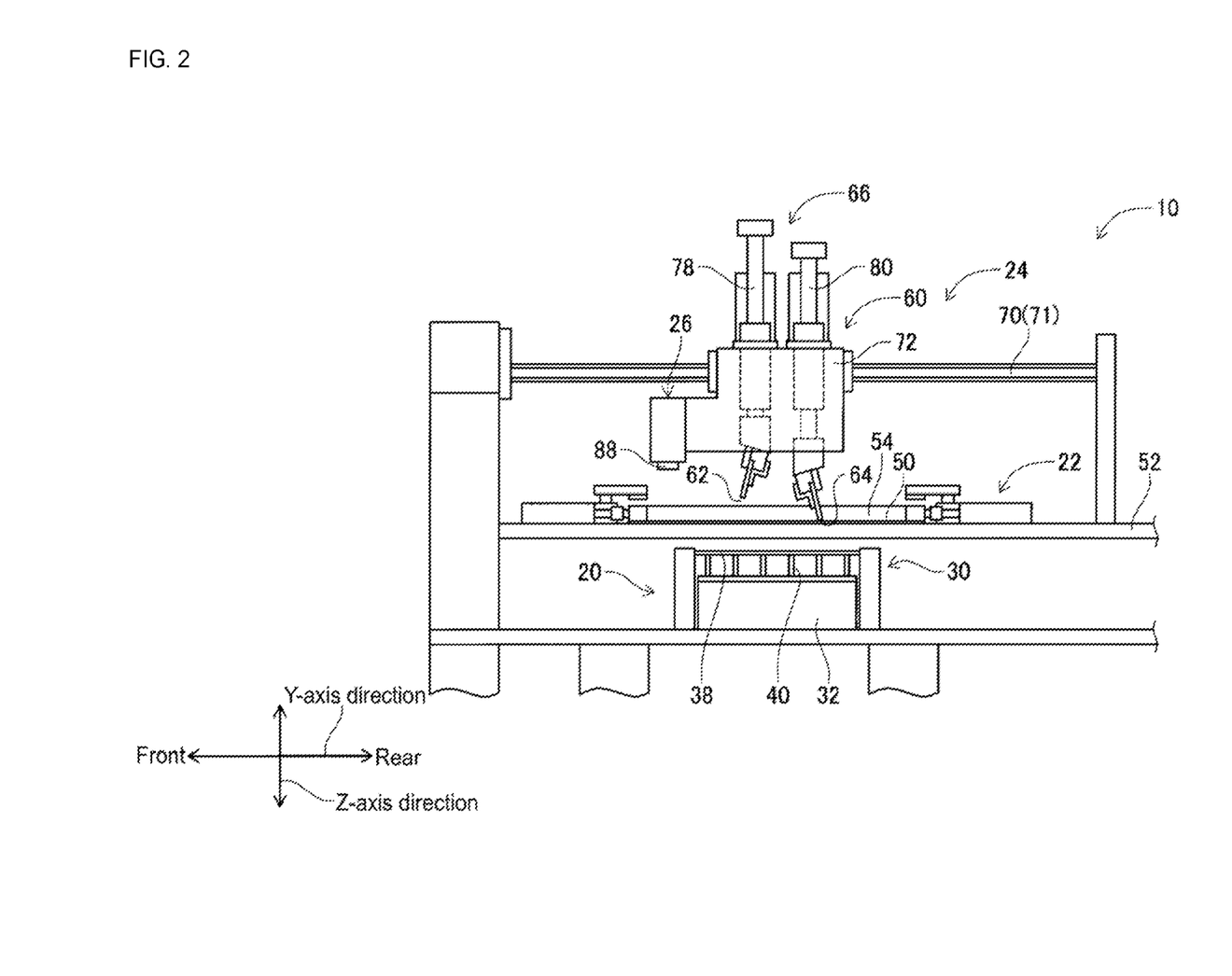
FIG. 2 is a side view of a solder paste printer.

FIGS. 1 and 2 show solder paste printer 10 of the present invention. Solder paste printer 10 is a device that prints solder paste onto a circuit board. Solder paste printer 10 is provided with conveyance device 20, stencil holding device 22, squeegee device 24, solder supply device 26, and control device 28 (refer to FIG. 3). FIG. 1 is a plan view showing solder paste printer 10 from above; FIG. 2 shows solder paste printer 10 from a side view.

Conveyance device 20 includes conveyor 30 and board raising and lowering device 32. Conveyor 30 includes pair of conveyor belts 34 and 35 that extend in the X-axis direction and electromagnetic motor 36 (refer to FIG. 3) that causes conveyor belt 34 to revolve. Circuit board 38 is supported by this pair of conveyor belts 34 and 35 and is conveyed in the X-axis direction by the driving of electromagnetic motor 36. Raising and lowering device 32 is provided between the pair of conveyor belts 34 and 35 and supports circuit board 38 that is supported by the pair of conveyor belts 34 and 35 from below via support pins 40 and raises and lowers circuit board 38 at a specified position.

Stencil holding device 22 is for holding stencil 50 in a fixed position. Stencil 50 is a sheet made of metal, for example, stainless steel, is formed with multiple throughholes (not shown), and is loaded on stencil supporting unit 52 that is provided above conveyance device 20. An opening section (not shown) that is smaller than the outer edges of stencil 50 is provided in stencil supporting unit 52 and stencil 50 is loaded on stencil supporting unit 52 so as to cover the opening. Thus, the lower surface of stencil 50, except for the outer edges, is exposed from the opening of stencil holding unit 52. Also, stencil holding device 22 includes frame 54 and mesh (not shown). Frame 54 is a frame slightly larger than the outer edges of stencil 50, and stencil 50 is arranged inside frame 54. The mesh is arranged such that frame 54 and the outer edges of stencil 50 are connected. Thus, stencil 50 is fixedly held by frame 54 via the mesh above conveyance device 20 such that the lower surface except for the outer edges is exposed. Note that, circuit board 38 conveyed to a specified position by conveyance device 20 closely contacts the lower surface of stencil 50 held by stencil holding device 22 by being raised by board raising and lowering device, and circuit board 38 is separated from the lower surface of stencil 50 by being lowered by board raising and lowering device 32.

Squeegee device 24 includes squeegee moving device 60, pair of squeegees 62 and 64, and squeegee raising and lowering device 66. Squeegee moving device 60 includes pair of guide rails 70 and 71, and slider 72. The pair of guide rails 70 and 71 are arranged extending in the Y-axis direction parallel to each other above stencil holding device 22. Slider 72 is slidably attached to pair of guide rails 70 and 71 so as to be slid to any position by operation of electromagnetic motor 76 (refer to FIG. 3). Each of the pair of squeegees 62 and 64 is substantially rectangular and made from a flexible material. The pair of squeegees 62 and 64 are arranged facing each other and extending in the X-axis direction, and are held below slider 72 by squeegee raising and lowering device 66.

Figure 3:
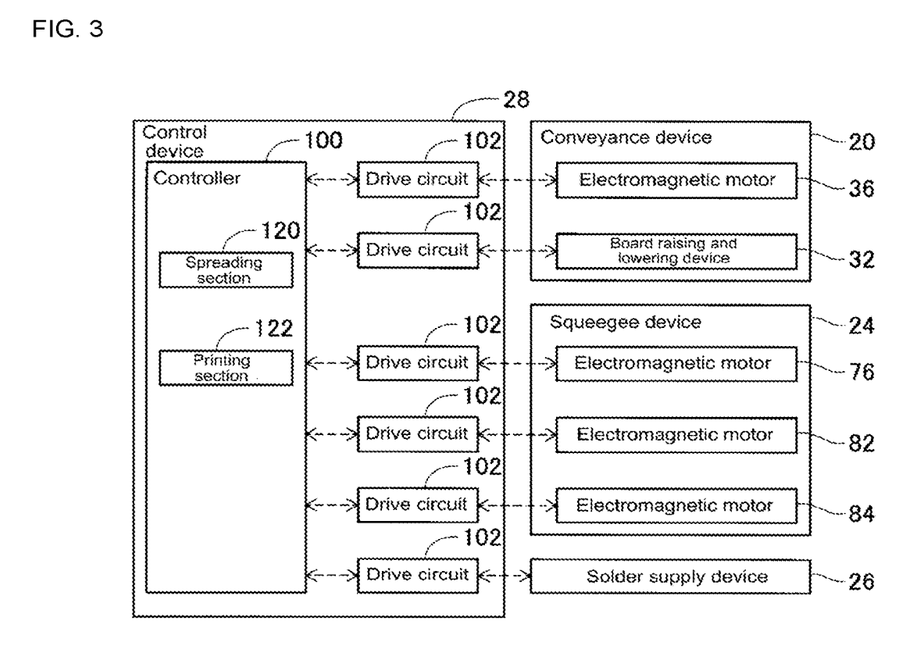
FIG. 3 is a block diagram showing a control device.

Squeegee raising and lowering device 66 includes pair of holding tools 78 and 80, and pair of electromagnetic motors 82 and 84 (refer to FIG. 3). Each of the pair of holding tools 78 and 80 is arranged extending in a vertical direction lined up in the Y-axis direction. Each of the holding tools 78 and 80 are held on slider 72 to be raised and lowered in a vertical direction, with the lower end of each holding tool 78 and 80 extending below the lower surface of slider 72. Squeegee 62 is held at the lower end of holding tool 78 oriented to extend in the X-axis direction, and squeegee 64 is held at the lower end of holding tool 80 oriented to extend in the X-axis direction.

The upper ends of the pair of squeegees 62 and 64 are close to each other, and the lower ends of the pair of squeegees 62 and 64 are separated from each other and at a slight angle, and face each other in the Y-axis direction. The pair of holding tools 78 and 80 are raised and lowered individually by respective operation of the pair of electromagnetic motors 82 and 84. According to such a configuration, with squeegee device 24, the pair of squeegees 62 and 64 are both slid in the Y-axis direction by squeegee moving device 60, and the pair of squeegees 62 and 64 are individually raised and lowered by squeegee raising and lowering device 66. Note that, in the direction in which pair of squeegees 62 and 64 face each other, that is, the direction from squeegee 62 to squeegee 64 in the Y-axis direction (the up direction in FIG. 1 and the right direction in FIG. 2) is sometimes referred to as the rear direction, and the direction from squeegee 64 to squeegee 62 (the down direction in FIG. 1 and the left direction in FIG. 2) is sometimes referred to as the front direction.

Solder supply device 26 is for supplying solder paste and discharge opening 88 for discharging solder paste is formed on a lower surface of solder supply device 26. Solder supply device 26 is fixed to a side surface of slider 72 at a central portion in the Y-axis direction. Therefore, solder supply device 26 can be moved to a given position in the Y-axis direction by operation of squeegee moving device 60.

As shown in FIG. 3, control device 28 is provided with controller 100 and multiple drive circuits 102. The multiple drive circuits 102 are connected to electromagnetic motors 36, 76, 82, and 84, board raising and lowering device 32, and solder supply device 26. Controller 100 is provided with a CPU, ROM, RAM, and so on, is formed mainly from a computer, and is connected to the multiple drive circuits 102. By this, operation of conveyance device 20, squeegee device 24, and so on is controlled by controller 100.

Operation of Solder Paste Printer

With solder paste printer 10, according to the above configuration, solder paste is supplied onto an upper surface of stencil 50 by solder supply device 26. Through-holes (not shown) are formed in stencil 50 to match the pattern of the pads and so on of circuit board 38. Also, by sliding squeegees 62 and 64 across the upper surface of stencil 50 to which solder paste has been supplied, solder paste is printed onto circuit board 38 via the through-holes of stencil 50.

Figure 4:
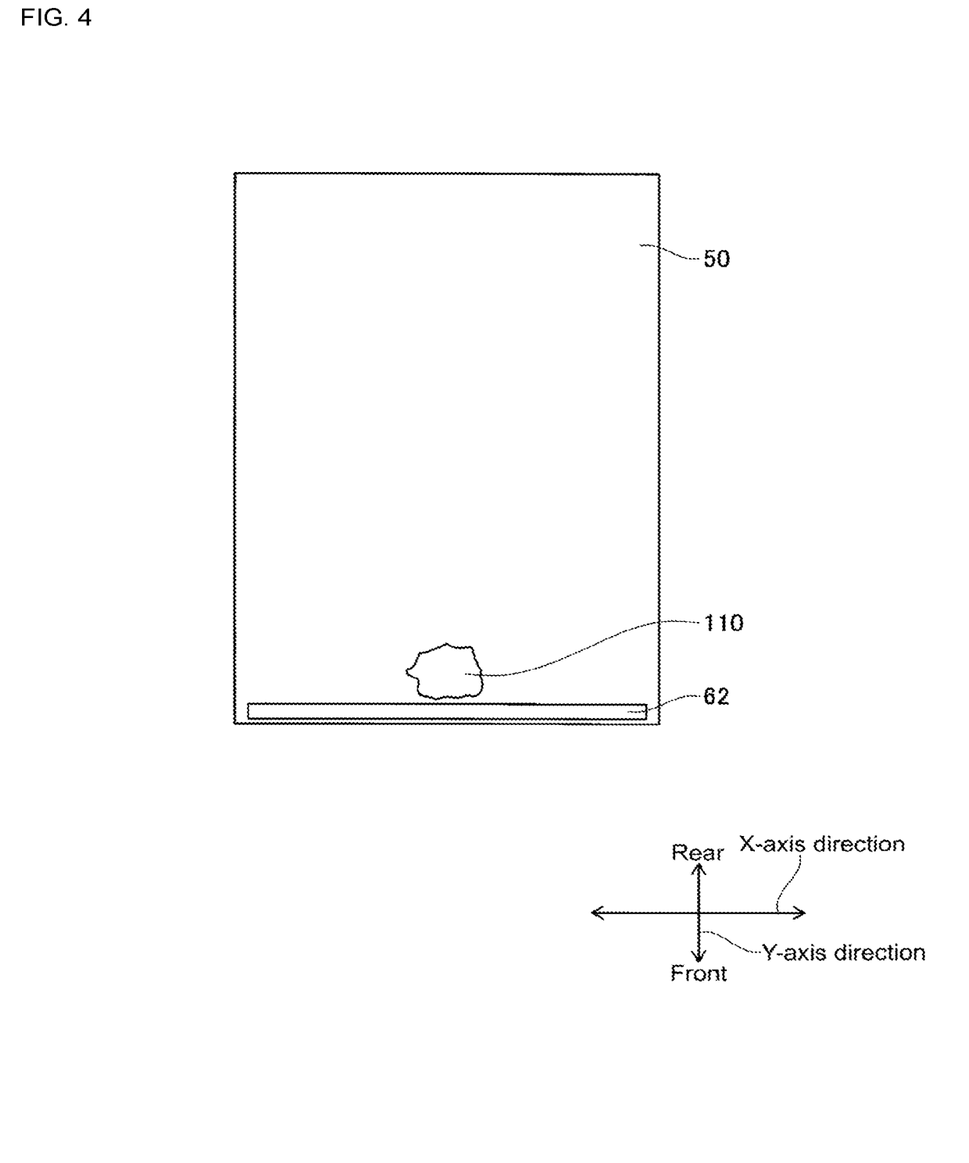
FIG. 4 is a plan view of a stencil with a blob of solder paste loaded on the stencil.

However, because solder supply device 26 that supplies solder paste is fixed to slider 72 that only slides in the Y-axis direction, it is possible to move to a given position in the Y-axis direction, but it is not possible to move in the X-axis direction. Therefore, as shown in FIG. 4, solder supply device 26 can only supply solder paste 110 on the upper surface of stencil 50 in a central area in the X-axis direction. In this manner, if printing to circuit board 38 is performed with solder paste 110 only supplied to a central area in the X-axis direction on the upper surface of stencil 50, solder paste 110 will only be printed onto a central area of circuit board 38 in the X-axis direction, which is undesirable. Therefore, before printing solder paste 110 onto circuit board 38, it is necessary to spread solder paste 110 supplied onto stencil 50 in the X-axis direction to form a solder roll.

Specifically, first, a film (not shown) is attached to the upper surface of circuit board 38. This prevents solder paste 110 being printed to circuit board 38 when making solder paste 110 into a roll. Circuit board 38 with the film attached is conveyed by conveyance device 20 and raised at a specified position by board raising and lowering mechanism. Thus, the upper side of circuit board 38 closely contacts the lower side of stencil 50 via the film.

Next, as shown in FIG. 4, solder paste 110 is supplied by solder supply device 26 in a blob onto a front end of stencil 50 in the Y-axis direction. Also, slider 72 is moved by squeegee moving device 60 to position squeegee 62 in front of solder paste 110, then squeegee 62 is lowered by squeegee raising and lowering device 66. Thus, the lower end of squeegee 62 contacts the upper surface of stencil 50. Here, operation of squeegee raising and lowering device 66 is controlled such that the force with which squeegee 62 presses towards stencil 50 (also referred to as "printing pressure") is 20 N. In detail, a load cell (not shown) for measuring the printing pressure is provided on squeegee raising and lowering 66 and values measured by the load cell are sent to controller 100. By performing feedback, control controller 100 operates squeegee raising and lowering device 66 such that the printing pressure reaches a specified size. When squeegee 62 is lowered, squeegee 64 is raised. Therefore, in FIG. 4, squeegee 62 is shown, but squeegee 64 is not shown. In the other figures too, the lowered squeegee is shown, but squeegees that are raised are not shown.

When the printing pressure of squeegee 62 reaches 20 N by the lowering of squeegee 62, with the printing pressure maintained at 20 N, slider 72 is moved to the rear. By this, squeegee 62 is slid towards the rear with the pressing force towards stencil 50 at 20 N. Note that, the moving speed of slider 72 here is 60 mm/sec, and the moving speed of slider 72 in the present embodiment is fixed, that is, is always 60 mm/sec. Therefore, the following descriptions omit descriptions related to the moving speed of slider 72.

As squeegee 62 is slid towards the rear, solder paste 110 is spread in the X-axis direction, that is, in the direction in which squeegee 62 extends. In detail, as described above, squeegee 62 is arranged at an angle, with the upper edge of squeegee 62 protruding further than the lower edge towards the rear in the sliding direction of squeegee 62. Therefore, by sliding squeegee 62, solder paste 110 scraped by squeegee 62 is pressed down by squeegee 62. Due to this, solder paste 110 is squeezed into the through-holes of stencil 50 and printed onto circuit board 38. However, as described later, the printing pressure when actually printing solder paste onto circuit board 38 is 50 N. However, the printing pressure when spreading solder paste 110 is 20 N, or less than half the pressure when actually printing solder paste. Therefore, the force with which solder paste 110 is pressed down by squeegee 62 is weak, and instead of solder paste 110 being pressed down, it spreads along squeegee 62. Therefore, solder paste 110 is spread in the direction in which squeegee 62 extends, that is, the X-axis direction, in accordance with the sliding of squeegee 62.

Of course, to a certain extent, the sliding of squeegee 62 causes solder paste 110 to fill the through-holes of stencil 50 due to the pressing down force. However, as described above, a film is attached to the upper surface of circuit board 38, so printing onto circuit board 38 is prevented. Also, because the printing pressure of squeegee 62 is low, solder paste 110 is not completely scraped by squeegee 62, and some solder paste 110 is left behind squeegee 62. In other words, a thin layer of solder paste 110 is left on the upper surface of stencil 50 after squeegee 62 has passed. In this manner, by sliding squeegee 62 towards the rear with a printing pressure of 20 N, solder paste 110 is spread in the X-axis direction, and a thin layer of solder paste 110 is left on the upper surface of stencil 50 after squeegee 62 has passed. The sliding to the rear of squeegee 62 is stopped before the solder paste 110 scraped by squeegee 62 reaches the mesh connected to the rear edge of stencil 50.

Next, when the sliding of squeegee 62 to the rear is stopped, squeegee 62 is raised. Then, slider 72 is moved by squeegee moving device 60 to position squeegee 64 to the rear of solder paste 110, then squeegee 64 is lowered by squeegee raising and lowering device 66. Thus, the lower end of squeegee 64 contacts the upper surface of stencil 50. Here, the printing pressure of squeegee 64 is the same as the printing pressure for squeegee 62 previously, that is, 20 N. Slider 72 is moved towards the front with the printing pressure maintained at 20 N. By this, squeegee 64 is slid towards the front with the pressing force towards stencil 50 at 20 N. In this case too, similar to when squeegee 62 is slid to the rear, solder paste 110 is spread in the X-axis direction, and a thin layer of solder paste 110 is left on the upper surface of stencil 50 after squeegee 64 has passed. The sliding to the front of squeegee 64 is stopped before the solder paste 110 scraped by squeegee 64 reaches the mesh connected to the front edge of stencil 50.

Figure 5:
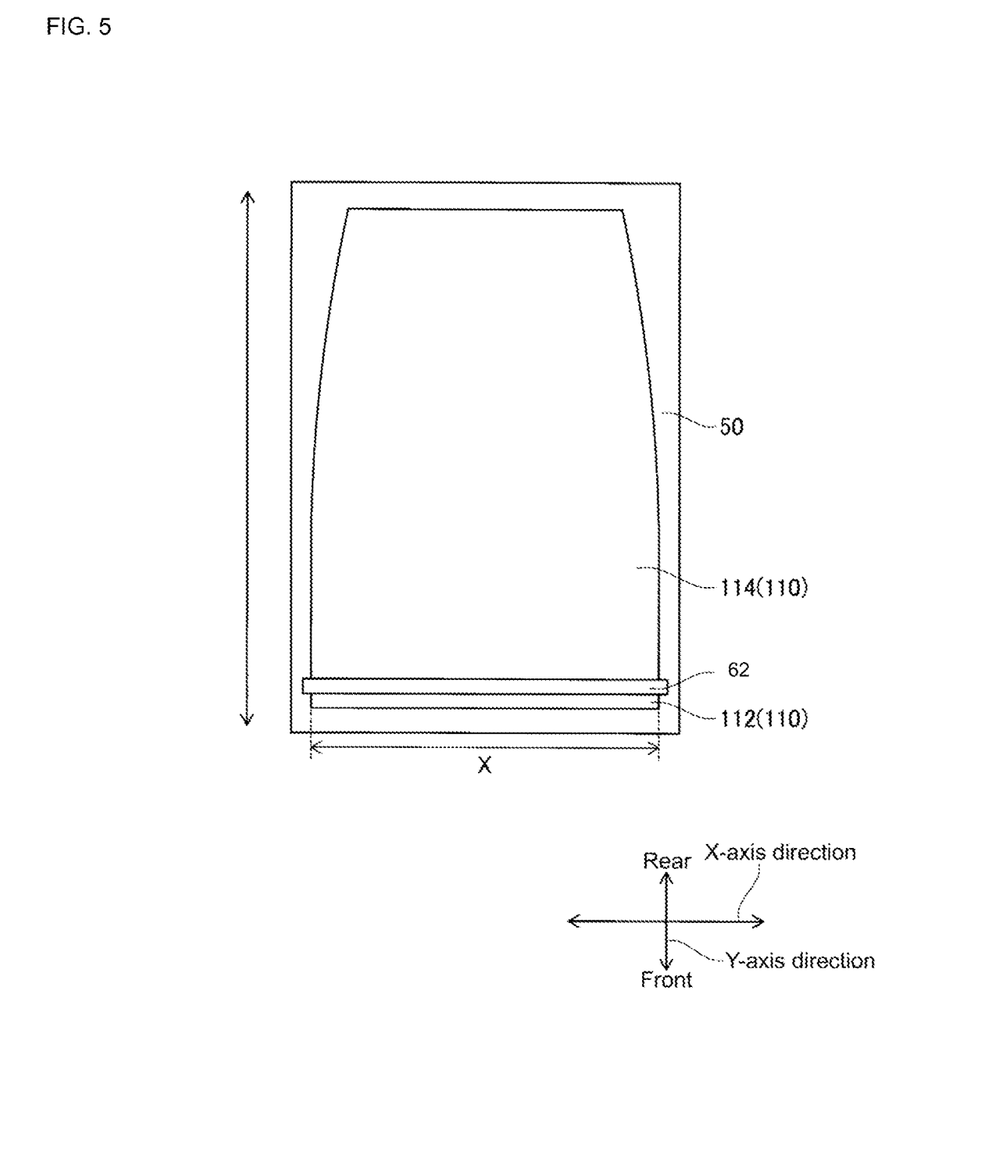
FIG. 5 is a plan view of the stencil with the solder paste spread into a roll.

In this manner, by sliding squeegee 64 towards the front after sliding squeegee 62 towards the rear, that is, by sliding squeegees 62 and 64 back and forth once in the Y direction, as shown in FIG. 5, solder paste 110 is made into a roll at the front side of squeegee 64, the roll being spread to have a length dimension X slightly shorter than the width of squeegee 64 in the X-axis direction. The double-ended arrow in the Y-axis direction on the left of stencil 50 in FIG. 5 represents squeegees 62 and 64 being slid back and forth in the Y direction once. Also, length dimension X of solder paste 110 in the X-axis direction is the target dimension for spreading solder paste 110 in the X-axis direction. In other words, by sliding squeegees 62 and 64 back and forth once in the Y direction at a printing pressure of 20 N, solder paste 110 is spread to the desired target dimension, with the printing pressure of 20 N being set to achieve the target dimension for spreading when sliding squeegees 62 and 64 back and forth once.

Also, by sliding squeegees 62 and 64 back and forth once in the Y direction, a thin layer of solder paste 110 scraped by squeegee 64 remains to the rear of squeegee 64. The roll of solder paste 110 to the front of squeegee 64 is sometimes referred to as roll portion 112, and the thin layer of solder paste 110 to the rear of squeegee 64 is sometimes referred to as thin layer portion 114. The thickness of thin layer portion 114 is about twice the diameter of the particles that make up the solder portion of the solder paste. In other words, if the diameter of the particles that make up the solder portion of the solder paste is 25 μm, the thickness of the thin layer portion is about 50 μm. Also, the dimension of the thin layer portion in the X-axis direction is length dimension X of roll portion 112 in the X-axis direction at the front end, and slightly smaller than length dimension X of roll portion 112 in the X-axis direction at the rear end.

When squeegees 62 and 64 have been slid back and forth once in the Y direction, that is, when the sliding of squeegee 64 towards the front has been stopped, squeegee 64 is raised. Then, slider 72 is moved by squeegee moving device 60 to position squeegee 62 in front of roll portion 112, then squeegee 62 is lowered by squeegee raising and lowering device 66. Thus, the lower end of squeegee 64 contacts the upper surface of stencil 50. Here, the printing pressure of squeegee 62 is 50 N. Slider 72 is moved towards the rear with the printing pressure maintained at 50 N. By this, squeegee 62 is slid towards the rear with the pressing force towards stencil 50 at 50 N.

Figure 6:
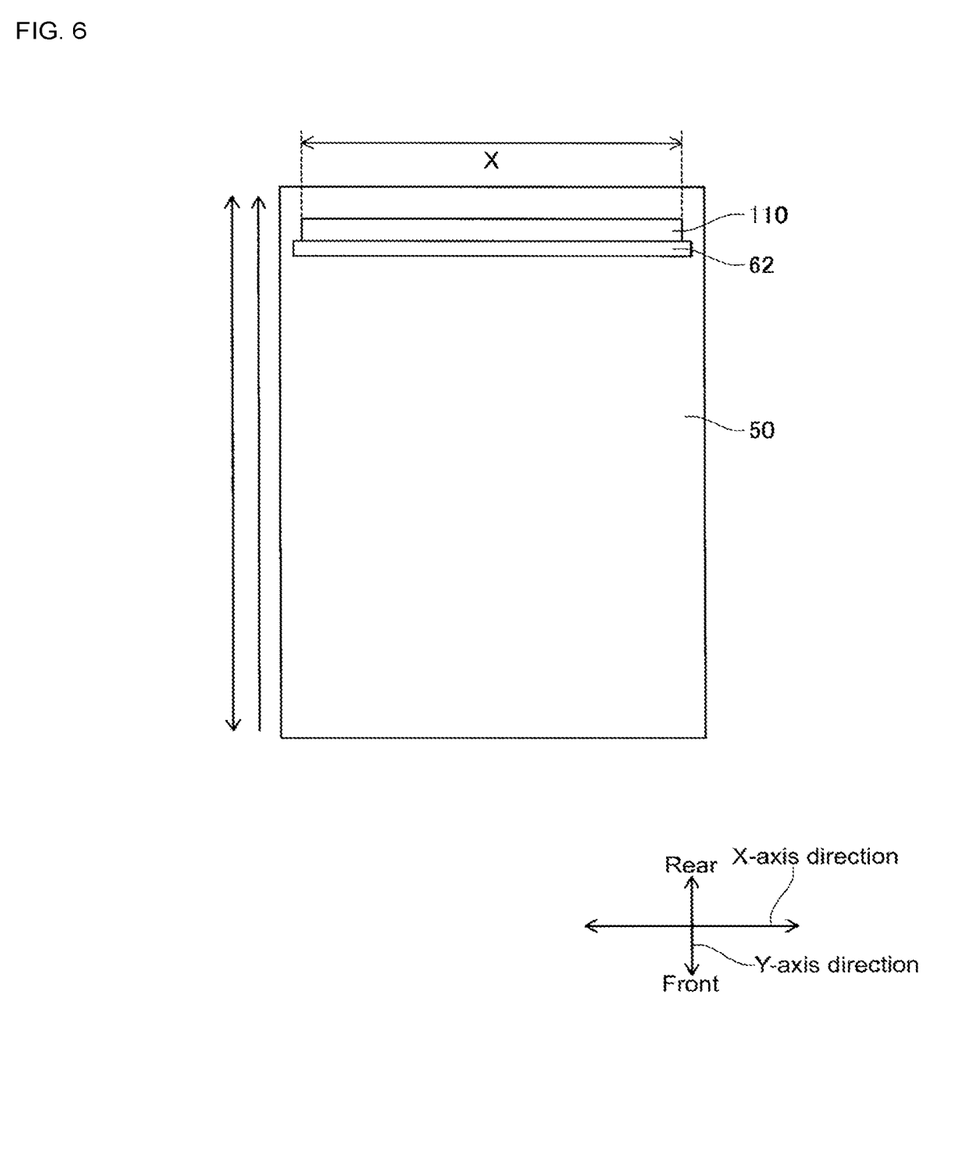
FIG. 6 is a plan view of the stencil with the solder roll formed by a method of the present invention.

Here, the printing pressure of the squeegee is more than double the printing pressure (20 N) when spreading solder paste 110, with squeegee 62 pressing with a strong force towards stencil 50. Therefore, thin layer portion 114 of solder paste 110 remaining on the upper surface of stencil 50 is scraped by squeegee 62. Also, the sliding to the rear of squeegee 62 is stopped before the solder paste 110 scraped by squeegee 62 reaches the mesh connected to the rear edge of stencil 50. Thus, as shown in FIG. 6, thin layer portion 114 remaining on the upper surface of stencil 50 is scraped by squeegee 62, and a roll of solder paste 110 with length dimension X is formed to the rear of squeegee 62. In this manner, by sliding squeegees 62 and 64 back and forth in the Y direction 1.5 times, the blob of solder paste 110 supplied onto stencil 50 is made into a roll of solder paste 110 with length dimension X. The double-ended arrow and the arrow pointing up in the Y direction on the left of stencil 50 in FIG. 6 represent squeegees 62 and 64 being slid back and forth in the Y direction 1.5 times.

According to the above procedure, after the roll of solder paste (also referred to as a "solder roll") is formed, solder paste 110 is printed onto circuit board 38. In detail, first, circuit board 38 is lowered by board raising and lowering device and conveyed by conveyance device 20. Then, the film attached to the upper surface of circuit board 38 is peeled off. This is collecting the film onto which solder paste 110 was printed via the through-holes in stencil 50 while the solder roll was being formed. Then, the circuit board 38 from which the film has been peeled is conveyed again by conveyance device 20 to the specified position and raised by board raising and lowering device 32. Thus, the upper side of circuit board 38 closely contacts the lower side of stencil 50.

Next, slider 72 is moved by squeegee moving device 60 to position squeegee 64 to the rear of the solder roll, then squeegee 64 is lowered by squeegee raising and lowering device 66. Thus, the lower end of squeegee 64 contacts the upper surface of stencil 50. Here, operation of squeegee raising and lowering device 66 is controlled such that the printing pressure is 50 N. Slider 72 is moved towards the front with the printing pressure maintained at 50 N. By this, squeegee 64 is slid towards the front with the pressing force towards stencil 50 at 50 N. Here, the solder roll is pressed towards stencil 50 with a strong printing pressure of 50 N by the sliding squeegee 64. By this, solder paste 110 is printed onto the upper surface of circuit board 38 via the through-holes in stencil 50 in the range of length dimension X of the solder roll. In this manner, with solder paste printer 10, a solder roll is formed with a lower printing pressure (20 N) than the printing pressure used when printing the solder paste (50 N), then printing is performed onto circuit board 38 using the formed solder roll.

Figure 7:
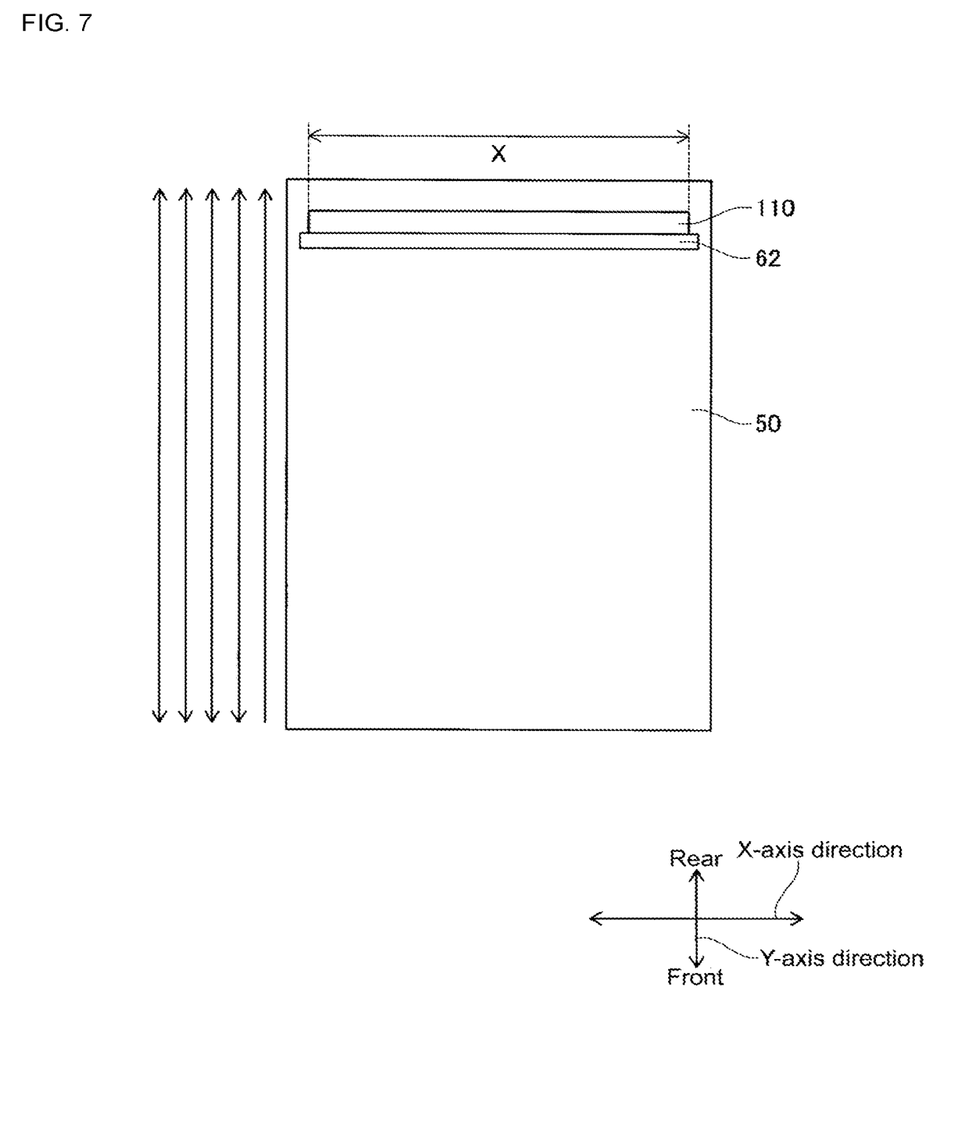
FIG. 7 is a plan view of the stencil with the solder roll formed by a conventional method.

In contrast, with a conventional solder paste printer, the solder roll is formed with the same printing pressure as when printing the solder paste (50 N). Therefore, because solder paste 110 is pressed towards stencil 50 with a strong force by squeegees 62 and 64, the solder paste is not spread appropriately, and squeegees 62 and 64 must be moved back and forth a large quantity of times. In detail, if the printing pressure when forming the solder roll is 50 N, because the force of squeegees 62 and 64 pressing down on solder paste 110 is strong, the solder paste 110 is hardly spread along squeegee 62 at all. Thus, although the solder paste 110 fills the through-holes of stencil 50 due to the sliding of squeegees 62 and 64, the solder paste 110 only gets spread a small amount. By sliding squeegees 62 and 64 back and forth multiple times, the solder paste 110 is spread gradually, so by sliding squeegees 62 and 64 back and forth 4.5 times in the Y direction, as shown in FIG. 7, the solder paste 110 is made into a roll of solder paste 110 with length dimension X. The double-ended arrows and the arrow pointing up in the Y direction on the left of stencil 50 in FIG. 7 represent squeegees 62 and 64 being slid back and forth in the Y direction 4.5 times.

In this manner, with a conventional solder paste printer, to form a solder roll with length dimension X, it is necessary to slide squeegees 62 and 64 back and forth 4.5 times, so the cycle time is slow. Also, because the printing pressure is high when forming the solder roll, solder paste 110 is pressed towards stencil 50 with a strong force, so a large amount of solder paste 110 passes through the through-holes in stencil 50 and leaks out from the underside of stencil 50, meaning that solder paste 110 is wasted. Further, if a large quantity of solder paste 110 leaks outs from the underside of stencil 50 while the solder roll is being formed, the underside of stencil 50 must be cleaned many times, thus increasing the load on workers.

On the other hand, with solder paste printer 10, because a solder roll with a length dimension X is formed by sliding squeegees 62 and 64 back and forth 1.5 times with a printing pressure (20 N) lower than the printing pressure used when printing the solder paste (50 N), worsening of the cycle time is prevented. Also, because it is possible to reduce the quantity of solder paste 110 that leaks out to the underside of stencil 50 by using a low printing pressure when forming the solder roll, it is possible to curtail wasting of solder paste 110 and to reduce the quantity of times that the underside of stencil 50 is cleaned.

Note that, as shown in FIG. 3, controller 100 includes spreading section 120 and printing section 122. Spreading section 120 is a functional section for spreading solder paste 110 into a roll, that is, for forming the solder roll. Printing section 122 is a functional section for printing solder paste 110 onto circuit board 38.

Second Embodiment

With solder paste printer 10 of the first embodiment, the quantity of times that squeegees 62 and 64 are slid is reduced by making the printing pressure when forming the solder roll lower than the pressure used for printing; with solder paste printer 10 of a second embodiment, the quantity of times that squeegees 62 and 64 are slid is reduced by making the moving speed of squeegees 62 and 64 when forming the solder roll faster than the moving speed used for printing.

Specifically, with solder paste printer 10 of a second embodiment, the moving speed of squeegees 62 and 64 when printing solder paste 110 onto circuit board 38 is 60 mm/sec, but when the solder paste 110 is being formed into a solder roll before printing onto circuit board 38, the moving speed of squeegees 62 and 64 is 100 mm/sec. In other words, the moving speed of squeegees 62 and 64 while forming the solder roll is 1.5 times or greater (100 mm/sec) than the moving speed of squeegees 62 and 64 (60 mm/sec) during printing. Here, the printing pressure of squeegees 62 and 64 is 50 N, and in the second embodiment, the printing pressure of squeegees 62 and 64 is kept constant at 50 N. Thus, hereon descriptions related to the printing pressure of squeegees 62 and 64 are omitted.

In this manner, by moving squeegees 62 and 64 at a relatively high speed while forming the solder roll using the same printing pressure as when printing, solder paste 110 is pressed by squeegee 62 with a relatively high printing pressure, but because of the fast speed at which squeegees 62 and 64 are moved, solder paste 110 is spread along squeegee 62 before solder paste 110 is sufficiently pressed down. Therefore, solder paste 110 is spread in the direction in which squeegee 62 extends, that is, the X-axis direction in accordance with the sliding of squeegee 62.

Thus, by moving squeegees 62 and 64 back and forth in the Y direction once at 100 mm/sec, similar to with the first embodiment, solder paste 110 is spread into a roll with a length dimension X. That is, by moving squeegees 62 and 64 back and forth once at 100 mm/sec, solder paste 110 is spread to the target length, so a moving speed of 100 mm/sec of squeegees 62 and 64 is set as the value for spreading to the target length. Also, because squeegees 62 and 64 are moved at high speed, similar to with the first embodiment, a thin layer of solder paste 110 is left on the upper surface of stencil 50 after the squeegee has passed. Thus, by moving squeegees 62 and 64 back and forth once in the Y-axis direction at 100 mm/sec, as shown in FIG. 5, roll section 112 is formed by squeegee 64 and thin layer portion 114 is left on the upper surface of stencil 50.

Then, after squeegees 62 and 64 have been moved back and forth once at 100 mm/sec, squeegee 62 is moved towards the rear at 60 mm/sec. That is, after squeegees 62 and 64 are moved at high speed such that solder paste 110 is spread into a solder roll with a length dimension X, squeegee 62 is moved towards thin layer portion 114 at low speed. By this, thin layer 114 remaining on the upper surface of stencil 50 is scraped by squeegee 62 and, as shown in FIG. 6, a solder roll with length dimension X is formed. In other words, with solder paste printer 10 of a second embodiment too, similar to with the first embodiment, by moving squeegees 62 and 64 back and forth 1.5 times, it is possible to make solder paste 110 supplied in a blob onto stencil 50 into a solder roll with length dimension X. In this manner, by moving squeegees 62 and 64 at a faster speed than the speed used when printing, it is possible to form the solder roll with a smaller quantity of movements. Note that, after the solder roll has been formed, solder paste 110 is printed onto circuit board 38; but because the step of printing solder onto circuit board 38 is the same as for the first embodiment, descriptions are omitted.

In an embodiment above, solder paste printer 10 is an example of a printing device. Control device 28 is an example of a control device. Stencil 50 is an example of a stencil. Squeegee moving device 60 is an example of a moving device. Squeegees 62 and 64 are examples of a squeegee. Spreading section 120 is an example of a spreading section. Printing section 122 is an example of a printing section. The step performed by spreading section 120 is an example of a spreading step. The step performed by printing section 122 is an example of a printing step.

Further, the present invention is not limited to the above example embodiments, and various changed or improved methods of embodiment are possible based on the knowledge of someone skilled in the art. Specifically, for example, in the first embodiment above, when forming the solder roll, the initial printing pressure is 20 N and a later printing pressure is 50 N; however, the printing pressure may be increased gradually from 20 N to 50 N or in stages from 20 N to 50 N. Also, in the second embodiment above, when forming the solder roll, the initial moving speed of squeegees 62 and 64 is 100 mm/sec and a later moving speed is 60 mm/sec; however, the moving speed may be reduced gradually from 100 mm/sec to 60 mm/sec or reduced in stages from 100 mm/sec to 60 mm/sec.

Also, when forming the solder roll, in the first embodiment the printing pressure is 20 N and in the second embodiment the moving speed of squeegees 62 and 64 is 100 mm/sec; however, the printing pressure when forming the solder roll or the moving speed of the squeegees may be set to any given value in accordance with characteristics of solder paste 110, the shape of through-holes of stencil 50, and the like. Characteristics of solder paste 110 may include the ratio of solder to flux in the solder paste, the diameter of solder particles in the solder paste, and so on.

Further, in the first embodiment, the printing pressure when forming the solder roll is lower than the printing pressure when printing, and in the second embodiment the moving speed of squeegees 62 and 64 when forming the solder roll is faster than the moving speed during printing; however, in addition to making the printing pressure when forming the solder roll lower than the printing pressure during printing, the moving speed of squeegees 62 and 64 when forming the solder roll may be faster than the moving speed of squeegees 62 and 64 when printing.

Also, in the embodiments above, solder paste 110 is ejected onto the upper surface of stencil 50 by solder supply device 26, but an operator may supply solder paste onto the upper surface of stencil 50 from a cup or the like.

REFERENCE SIGNS LIST

10: solder paste printer (printing device);
28: control device;
50: stencil;
60: squeegee moving device (moving device);
62: squeegee;
64: squeegee;
120: extending section (extending method);
122: printing section (printing method)

The invention claimed is:

1. A printing device comprising:
a stencil;
a squeegee configured to slide on an upper surface of the stencil in which through-holes are formed;
a moving device configured to move the squeegee back and forth along a first direction, the moving device including a pair of guide rails extending in the first direction, and a slider slidably attached to the pair of guide rails;
a squeegee raising and lowering device which raises and lowers the squeegee, the squeegee raising and lowering device including a holding tool and a motor; and
a control device configured to control operation of the moving device, the control device including
a spreading section configured to spread a viscous material loaded on the upper surface of the stencil so as to form a roll of the viscous material disposed in front of the squeegee in the first direction and extending in a second direction in which the squeegee extends by controlling the moving device to slide the squeegee, the second direction being perpendicular to the first direction, and a thin layer of the viscous material disposed to a rear of the squeegee in the first direction, a length of the thin layer of the viscous material in the second direction being equal to a length of the roll of the viscous material in the second direction at a front end of the thin layer of viscous material in the first direction, and the length of the thin layer of the viscous material in the second direction being less than the length of the roll of the viscous material in the second direction at a rear end of the thin layer of viscous material in the first direction, and
a printing section configured to squeeze the roll of the viscous material that was spread by the spreading section into the through-holes of the stencil by controlling the moving device to slide the squeegee such that the viscous material is printed onto a board that is closely contacting a lower surface of the stencil,
wherein the control device is configured to control the squeegee raising and lowering device so that a pressing force of the squeegee towards the stencil when the squeegee is slid by the spreading section is smaller than a pressing force of the squeegee towards the stencil when the squeegee is slid by the printing section.

2. The printing device according to claim 1, wherein the control device is configured to control the squeegee raising and lowering device so that the pressing force of the squeegee towards the stencil when the squeegee is slid by the spreading section is larger at a sliding end period than at a sliding beginning period.

3. The printing device according to claim 1, wherein the spreading section is configured to control the moving device to slide the squeegee back and forth 1.5 times in the first direction to form the roll of the viscous material.

4. A printing device comprising:
a stencil;
a squeegee configured to slide on an upper surface of the stencil in which through-holes are formed;
a moving device configured to move the squeegee back and forth along a first direction, the moving device including a pair of guide rails extending in the first direction, and a slider slidably attached to the pair of guide rails; and
a control device configured to control operation of the moving device, the control device including
a spreading section configured to spread a viscous material loaded on the upper surface of the stencil so as to form a roll of the viscous material disposed in front of the squeegee in the first direction and extending in a second direction in which the squeegee extends by controlling the moving device to slide the squeegee, the second direction being perpendicular to the first direction, and a thin layer of the viscous material disposed to a rear of the squeegee in the first direction, a length of the thin layer of the viscous material in the second direction being equal to a length of the roll of the viscous material in the second direction at a front end of the thin layer of viscous material in the first direction, and the length of the thin layer of the viscous material in the second direction being less than the length of the roll of the viscous material in the second direction at a rear end of the thin layer of viscous material in the first direction, and
a printing section configured to squeeze the roll of the viscous material that was spread by the extending section into the through-holes of the stencil by controlling the moving device to slide the squeegee such that the viscous material is printed onto a board that is closely contacting a lower surface of the stencil,
wherein the control device is configured to control the moving device so that a moving speed of the squeegee when the squeegee is slid by the spreading section is greater than a moving speed of the squeegee when the squeegee is slid by the printing section.

5. The printing device according to claim 4, wherein the control device is configured to control the moving device so that the moving speed of the squeegee when the squeegee is slid by the spreading section is greater at a sliding beginning period than at a sliding end period.

6. The printing device according to claim 4, wherein the spreading section is configured to control the moving device to slide the squeegee back and forth 1.5 times in the first direction to form the roll of viscous material.

* * * * *